US007746624B2

(12) United States Patent
Rispoli et al.

(10) Patent No.: US 7,746,624 B2
(45) Date of Patent: Jun. 29, 2010

(54) CURRENT TRANSFORMER DISCONNECT SWITCH

(75) Inventors: James Rispoli, Monroe Township, NJ (US); John A. Gaffney, Bronx, NY (US)

(73) Assignee: Consolidated Edison Company of New York, Inc., New York, NY (US)

( * ) Notice: Subject to any disclaimer, the term of this patent is extended or adjusted under 35 U.S.C. 154(b) by 224 days.

(21) Appl. No.: 11/923,735

(22) Filed: Oct. 25, 2007

(65) Prior Publication Data

US 2009/0109632 A1 Apr. 30, 2009

(51) Int. Cl.

| | |
|---|---|
| ***H02B 1/26*** | (2006.01) |
| *H01H 19/20* | (2006.01) |
| *G01R 11/32* | (2006.01) |
| *H01H 33/12* | (2006.01) |
| *H02B 1/24* | (2006.01) |

(52) U.S. Cl. ....................... 361/623; 361/620; 361/663; 361/631; 200/50.39; 200/570; 324/142; 218/12; 218/45; 218/100; 307/131

(58) Field of Classification Search ................. 361/620, 361/623, 631–632, 663; 200/50.39, 570; 324/142; 218/12, 45, 100; 307/131; 174/68.1–136
See application file for complete search history.

(56) References Cited

U.S. PATENT DOCUMENTS 7,270,576 B2 * 9/2007 Kim et al. ................... 439/627

OTHER PUBLICATIONS

Erickson Electric, Pad Mounted Metering Transformer Section & Main Switch, May 1, 2007, pp. 1-4.*

* cited by examiner

*Primary Examiner*—Zachary M Pape
(74) *Attorney, Agent, or Firm*—Cantor Colburn LLP

(57) ABSTRACT

A current transformer cabinet is disclosed having an electrical meter coupled to current transformers. One or more disconnect switches arranged between the source conductors and the load conductors. The disconnect switches include a link member that allows the disconnecting of electrical service from the load conductors by rotation of the link from a first position to a second position.

13 Claims, 4 Drawing Sheets

CURRENT TRANSFORMER DISCONNECT SWITCH

BACKGROUND OF THE INVENTION

The present invention relates generally to a current transformer cabinet for electrical service and more particularly to a current transformer cabinet having a disconnect switch.

Electrical power is typically generated at centralized production facility such as a coal-fired power plant. The electrical power is distributed to end users through an electrical network maintained by the electrical utility. As the electrical power is transmitted through the distribution system, a number of components and systems are used to monitor and control the flow of electricity. A substation, for example, is a facility operated by the utility to transform the generated electrical power into a form that is usable by the utilities customers.

The end user, or customer, typically purchases the electricity based on the quantity of electrical power that is consumed by the customers. To facilitate the accurate monitoring of the customers consumption, the utility installs a meter where the electrical power enter the customer's facility. The meter is typically connected, or an integral part of what is known as a current transformer cabinet. A current transformer ("CT") is a device that that includes a winding that is wrapped around a core that is usually in the shape of a ring. The CT is arranged to provide a current in its winding that is proportional to the current flowing through a conductor that is adjacent the core.

By coupling the conductors entering the customer's facility to one or more CT's, the utility can measure the accumulated amount of electrical power the customer consumes. In industrial and commercial facilities, the customer may require three-phase power. In this instance, each conductor associated with a phase of electrical power will have an associated CT to measure the current.

While existing current transformer cabinets are suitable for their intended purposes, there still remains a need for improvements particularly regarding the disconnecting of electrical power from the customers facility in a reliable manner.

SUMMARY OF THE INVENTION

A current transformer cabinet is provided having a housing and at least one current transformer mounted to the housing. A disconnect switch is included having a first and second standoff. The disconnect switch further has a link mounted for rotation at the first standoff and is arranged to electrically engage the second standoff. A first terminal connector electrically couples the second standoff to the current transformer.

A current transformer cabinet is also provided having a source conductor. A current transformer is electrically coupled to the source conductor. A disconnect switch having a first standoff is electrically coupled to the source conductor. The disconnect switch has an electrically conductive link that is rotatably coupled to the first standoff. A second standoff on the disconnect switch is disengagably coupled to the link. A load conductor is also coupled to the second standoff.

A disconnect switch for a current transformer cabinet is also provided having a source conductor coupled to a current transformer and a load conductor. The disconnect switch includes a first base member. A first standoff is mounted to the first base member and is coupled to the source conductor opposite the current transformer. A second standoff has a projection on one end and is mounted to the first base member. The second standoff is arranged to be coupled to the load conductor. Finally, a link coupled to the first standoff. The link is arranged to rotate around the projection between a first position, where the link engages the second standoff, and a second position where the link is disengaged from the second standoff.

BRIEF DESCRIPTION OF THE DRAWINGS

Referring now to the drawings, which are meant to be exemplary and not limiting, and wherein like elements are numbered alike.

DETAILED DESCRIPTION

Figure 1:
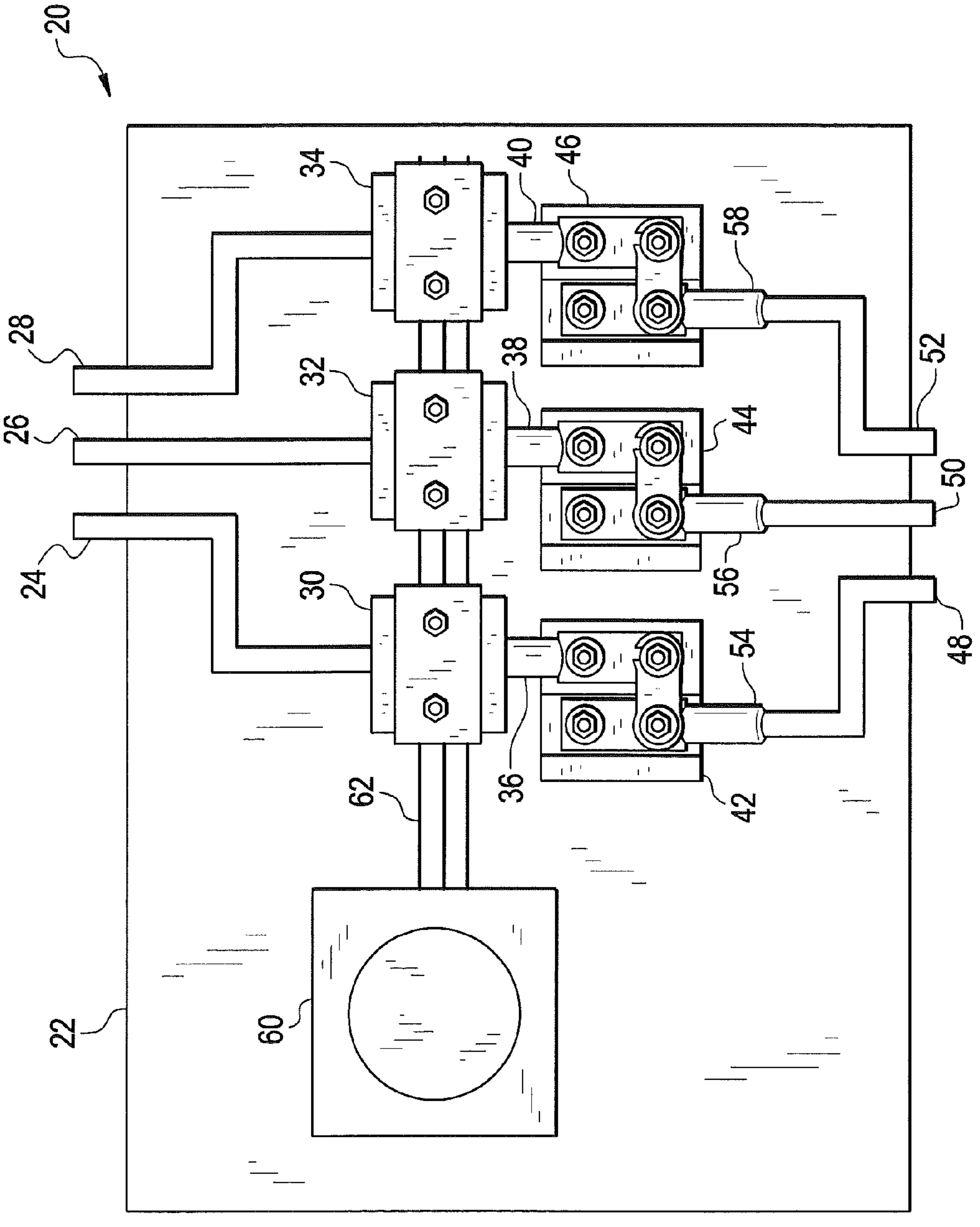
FIG. 1 is a schematic illustration of a current transformer cabinet in accordance with an exemplary embodiment.

FIG. 1 illustrates an exemplary embodiment of a current transformer cabinet 20. The cabinet 20 includes a housing 22 that is used to mount the components of cabinet 20 and shield the electrical components from the environment. Source conductors 24, 26, 28 enter the cabinet and couple to a current transformers 30, 32, 34 respectively. The conductors 24, 26, 28 may be a cable, such as a stranded cable for example, or alternatively a solid conductor, such as a busbar for example. The cabinet 20 is described herein with respect to a three-phase electrical system where each conductor 24, 26, 28 carry a different electrical phase. In the exemplary embodiment, the cabinet 20 is capable of transferring 200 A-400 A of electrical power. It should be appreciated that cabinet 20 may also have only two phases or a single phase.

A second set of conductor 36, 38, 40 connects each of the current transformer 30, 32, 34 to disconnect switches 42, 44, 46. Each of the disconnect switches 42, 44, 46 are connected to a set of corresponding load-side conductors 48, 50, 52 by terminal connectors 54, 56, 58 respectively. The load side conductors 48, 50, 52 connect the cabinet 20 to the end user facility where the electrical power is consumed. An electrical meter 60 is coupled to a meter socket (not shown) that mounted to the housing 22. The electrical meter 60 is electrically connected to receive a signal from the current transformers 30, 32, 34 via cables 62. As electrical power is consumed by the facility connected to cabinet 20, the electrical meter 60 measures the current being generated in the current transformers 30, 32, 34. Since the current generated by the current transformers 30, 32, 34 is representative of the electrical power flowing to the end user facility, the amount of electrical power being consumed may be measured. The electrical meter 60 measures the current and stores data representing the cumulative amount of consumed electrical power. This data is periodically monitored and recorded by the electrical utility.

Cabinet 20 may further include other components (not shown) such as relays, communications devices, contactors and the like. For example, while traditionally, utility employees were sent on a monthly basis to inspect the electrical meter 60 and record the electrical consumption, the cabinet 20 may include a communications device (not shown) that is electrically coupled to the meter. The communications device allows the electrical utility to record electrical consumption without having to physically travel to the cabinet 20. The cabinet 20 may also have other devices that allow the measurement of not only the aggregate amount of electrical power consumed, but also data associated with when the electrical power is consumed. In this manner, the electrical utility may charge the end user different tariff rates based on the time of consumption.

Figure 2:
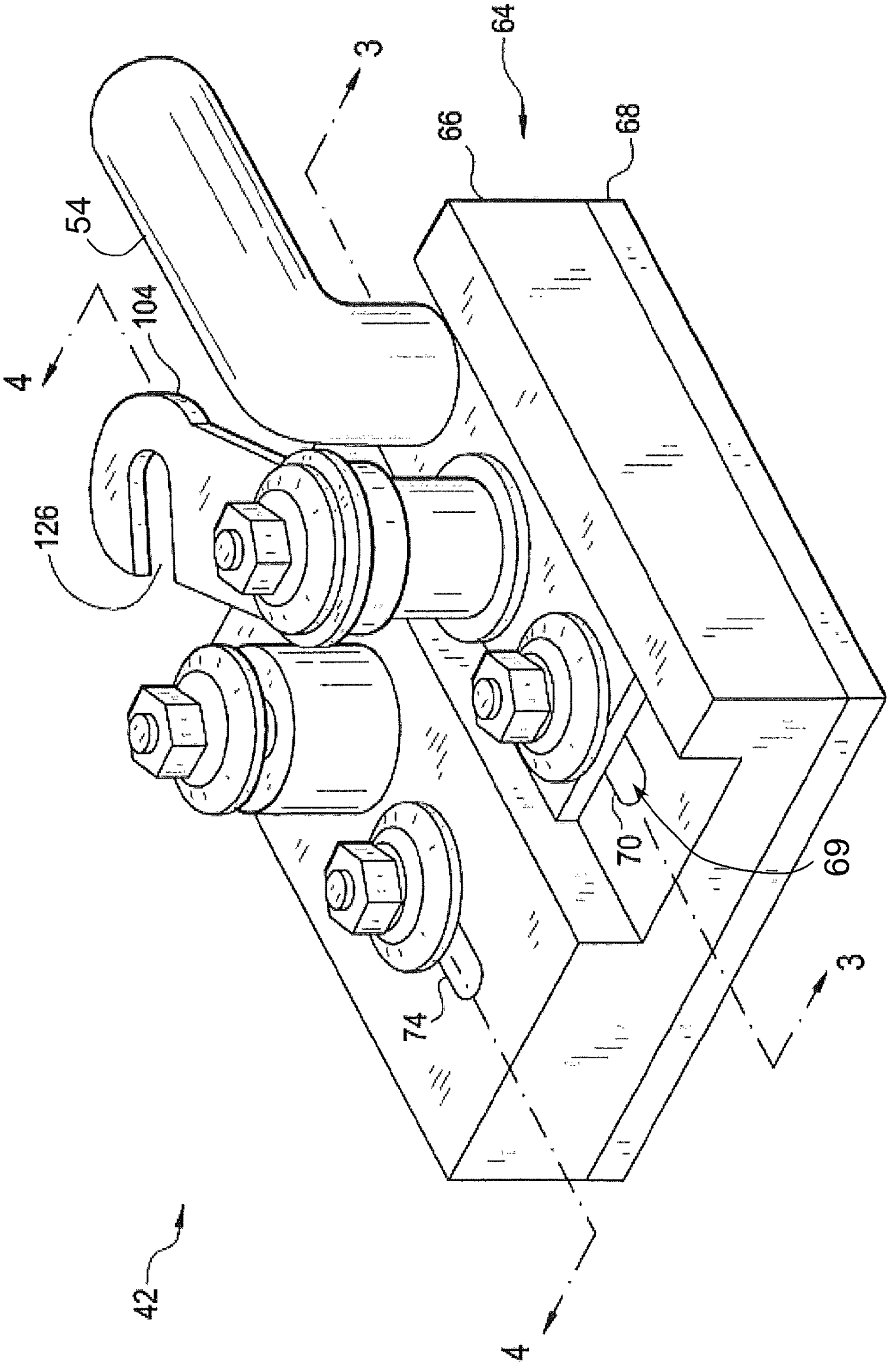
FIG. 2 is a perspective illustration of a disconnect switch of FIG. 1 in the open position.
Figure 3:
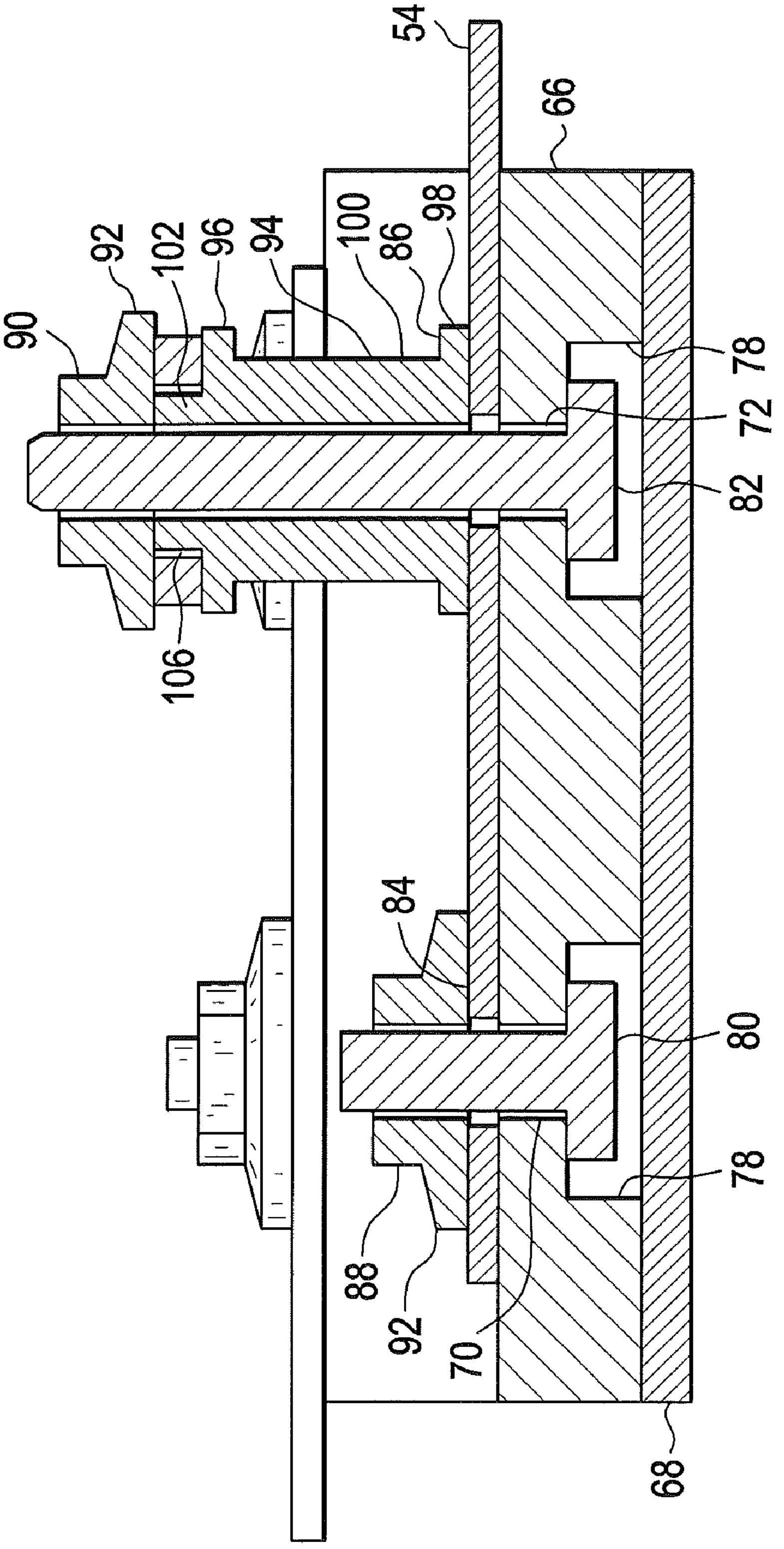
FIG. 3 is a sectional view illustration of the disconnect switch of FIG. 2.
Figure 4:
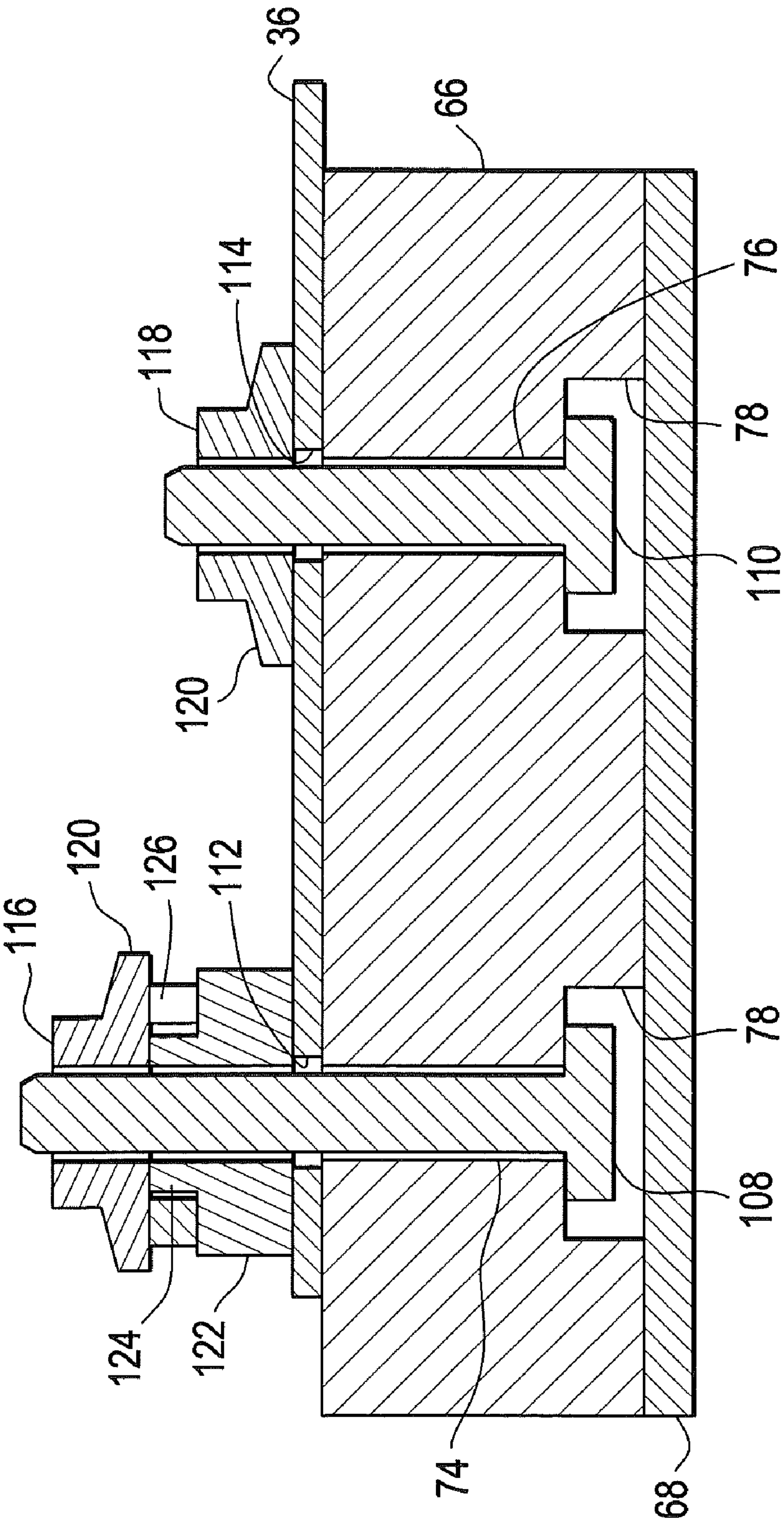
FIG. 4 is another sectional view illustration of the disconnect switch of FIG. 2.

Referring to FIGS. 2-4, the disconnect switches 42, 44, 46 will be described. For illustrative purposes, each of the disconnect switches 42, 44, 46 will be described with respect to disconnect switch 42. The disconnect switch 42 has base 64 that has an upper portion 66 and a lower portion 68. The base 64 made be made from any suitable material capable of electrically insulating the current carrying components of the disconnect switch 42 from the housing 22. In the exemplary embodiment, the base 64 is made from a material such as phenolic or a polyester glass thermoset plastic for example. The base upper portion 66 has a channel 69 that is sized to fit the terminal connector 54. A pair of slots 70, 72 extend through the upper portion 66. The slots 70, 72 are arrange to allow the base 64 to be used with different size terminal connectors without having to change the disconnect switch 42. A second pair of slots 74, 76 extend through the base upper portion 66. The second pair of slots 74, 76 are also arranged to allow adjustment for the use of different size terminal connectors. A recess area 78 is associated with each of the slots 70, 72, 74, 76 along the bottom surface of the base upper portion 66. The base lower portion 68 is connected to the base upper portion 66 and insulates the current carrying components of disconnect switch 42 from the housing 22.

A pair of threaded fasteners 80, 82, such as a bolt for example, extend through the slots 70, 72. To aid in the assembly and disassembly in the field, the threaded fasteners 80, 82 have a head portion sized to fit within the recess area 78. When arranged in this manner, the fasteners 80, 82 may tightened and loosened in the field without having to secure the head of the fasteners. The fasteners 80, 82 are received by holes in the terminal connector 54 that is secured to the base 64 by fastener 88, 90. The fasteners 80, 82, 88, 90 may be made of any suitable material capable of securely coupling the terminal connector 54 to the base upper portion 66 such as but not limited to brass, steel and copper. In the exemplary embodiment, the fasteners 80, 82 are made from brass and the fasteners 88, 90 are made from copper. In the exemplary embodiment, the fasteners 88, 90 have flange portion 92. A standoff 94 is positioned between fastener 90 and the terminal connector 54. The standoff 94 has an upper and lower flange 96, 98 and a recessed portion 100 therebetween. The recessed portion provides additional clearance between the standoff 94 and the terminal connector 56 to avoid electrical arcing when the disconnect switch 42 is opened. A projection 102 extends from the top of the standoff 94. The projection 102 is sized to be received in a hole 106 in link 104. In the exemplary embodiment, the standoff 94 is made from a electrically conductive material, such as copper or aluminum for example.

A second pair of fasteners 108, 110, such as a bolt for example, extends through the slots 74, 76. The fasteners 108, 110 receive the holes 112, 114 in the terminal conductor 36 that is captured by fasteners 116, 118. The fasteners 108, 110, 116, 118 may be made of any suitable material capable of securely coupling the conductor 36 to the base upper portion 66, such as but not limited to steel and copper. In the exemplary embodiment, the fasteners 108, 110 are made from brass and the fasteners 116, 118 are made of copper. In the exemplary embodiment, the fasteners 116, 118 also have a flange portion 120. A second standoff 122 is captured between fastener 116 and conductor 36. A projection 124 extends from the top of second standoff 122. The projection 124 is sized to be received in a slot 126 in link 104. In the exemplary embodiment, the standoff 122 is made from a electrically conductive material, such as copper or aluminum for example.

The link 104 connects the first standoff 94 and the second standoff 122 to provide an electrical path through the disconnect switch 42. The link is made of a suitable electrically conductive material, such as but not limited to copper and aluminum. The link has a first end with a hole 106 that is received on projection 102. The link 104 also includes a slot 126 on the end opposite the hole 106. The slot 126 is arranged to engage the projection 124. In the exemplary embodiment, the slot 126 is arcuate in shape with the radius of the arc for the centerline of the slot 126 being the distance between the centers of fasteners 82 and fastener 108. The link 104 is movable between a closed position with the slot 126 engaging the projection 124 and an open position shown in FIG. 2. When in the open position the electrical connection through the disconnect switch 42 is broken and no electrical power is delivered to the load side of the cabinet 20.

During operation, the cabinet 20 is installed adjacent to the end user facility and the adjoining electrical distribution network of the electrical utility. The electrical utility provides a connection to the source-side conductors 24, 26, 28 from the electrical distribution network. A second connection is made from the load-side conductors 48, 50, 52 to the end users facility. The meter 60 is installed and connected to the current transformers 30, 32, 34 via cable 62. The link 104 is closed so that the slot 126 engages the projection 124. The fasteners 90, 126 are tightened to prevent movement of the link 104. The cabinet 20 is then secured to prevent tampering with the meter 60. When the conductors 24, 25, 28 are energized with electrical power, and there is demand from the end user facility, the electrical power flows through the conductors 24, 26, 28, through the current transformers 30, 32, 34 to the disconnect switches 42, 44, 46.

As above, for illustrative purposes, the operation of the cabinet 20 will be described with respect to disconnect switch 42. Since the terminal connector 36 is securely fastened to the disconnect switch 42 by fasteners 108, 116 and fasteners 110, 118, the electrical power will from the terminal conductor 36 into the disconnect switch 42. The standoff 122, which is made from an electrically conductive material such as copper for example, transfers the electrical power to the link 104 that acts as a bridge and transfers the electrical power to standoff 96. The electrical power then flows through standoff 96 and into terminal connector 54 that transmits the electrical power to conductor 48 and the end user facility.

In the event that electrical power service needs to be removed from the end user facility, to allow maintenance or repairs for example, the disconnect switches 42, 44, 46 provide electrical utility has a fast and reliable means of preventing the flow of electricity without having to disconnect cables or conductors. When disconnection of the electrical service is desired, the electrical utility unsecures the cabinet 20 allowing access to the disconnect switches 42, 44, 46. By loosening the fasteners 90, 116 with a single hand tool, the link 104 may be separated from the standoff 122 that interrupts the flow of electrical power through the cabinet 20.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A current transformer cabinet comprising:

a housing;

at least one current transformer mounted to said housing;

a disconnect switch having a first and second standoff and a link mounted for rotation at said first standoff and arranged to electrically engage said second standoff;

a first terminal conductor electrically coupling said second standoff to said at least one current transformer;

wherein said second standoff includes a first projection extending from one end, and said link has a slot arranged and sized to engage said first projection;

wherein said first standoff includes a second projection, and said link includes a hole sized to fit said second projection wherein said link rotates about said second projection; and, wherein said first terminal conductor includes a first fastener arranged concentrically through a hole in said first projection and a second fastener engaging said first fastener.

2. The current transformer cabinet of claim 1 further comprising a second terminal conductor electrically coupled to said first standoff, said second terminal conductor includes a third fastener arranged concentrically through a hole in said second projection and a fourth fastener engaging said third fastener.

3. The current transformer cabinet of claim 2 wherein said disconnect switch further includes a base mounted between said housing and said first and second terminal conductors, said base being made from a nonconductive material.

4. The current transformer cabinet of claim 3 further comprising an electrical meter electrically coupled to said at least one current transformer.

5. A current transformer cabinet comprising:

a source conductor;

a current transformer electrically coupled to said source conductor;

a disconnect switch comprising: a first standoff, a second standoff electrically coupled to said source conductor, an electrically conductive link rotatably coupled to said first standoff and disengagably coupled to said second standoff, wherein said first standoff includes a first projection extending from an end of said first standoff, and wherein said link is movable between a first position and a second position wherein said link engages said second standoff when in said first position and is disengaged from said second standoff when in said second position;

a load conductor coupled to said first standoff; and, wherein said disconnect switch further includes a first fastener coupled to and arranged coaxially with said first projection and a second fastener coupled to said first fastener wherein said second fastener and first fastener are arranged to securely couple said link to said first standoff.

6. The current transformer cabinet of claim 5 wherein said link has a first end having a hole sized to fit over said first projection, and a second end having an arcuate slot.

7. The current transformer cabinet of claim 6 wherein said second standoff includes a second projection extending from an end of said second standoff.

8. The current transformer cabinet of claim 7 wherein said first standoff has a recessed portion, said recessed portion being sized to prevent electrical arcing between said first standoff and said second standoff when said link is in a second position.

9. A disconnect switch for a current transformer cabinet having a source conductor, a current transformer coupled to said source conductor and a load conductor comprising: a first base member a first standoff mounted to said first base member and coupled to said load conductor opposite said current transformer; a second standoff having a projection on one end, said second standoff mounted to said first base member and coupled to said source conductor; a link coupled to said first standoff, said link arranged to rotate around said projection between a first position wherein said link engages said second standoff, and a second position wherein said link is disengaged from said second standoff; a first and second threaded fastener mounted in said first base member, said first threaded fastener arranged to extend through said first standoff and said second threaded fastener arranged to extend through said second standoff.

10. The disconnect switch of claim 9 wherein said first and second standoff are made from copper.

11. The disconnect switch of claim 10 further comprising a third fastener removably coupled to said first threaded fastener, said third fastener having a flange portion that is arranged to engage and secure said link against said first standoff.

12. The disconnect switch of claim 11 further comprising a fourth fastener removably coupled to said second threaded fastener, said fourth fastener having a flange portion that is arranged to engage and secure said link against said second standoff.

13. The disconnect switch of claim 12 further comprising a second base member mounted to said first base member, said second base member being sized to cover said first and second threaded fasteners.

* * * * *